United States Patent
Sadana et al.

(10) Patent No.: US 6,878,611 B2
(45) Date of Patent: Apr. 12, 2005

(54) PATTERNED STRAINED SILICON FOR HIGH PERFORMANCE CIRCUITS

(75) Inventors: Devendra K. Sadana, Pleasantville, NY (US); Stephen W. Bedell, Wappingers Falls, NY (US); Tze-Chiang Chen, Yorktown Heights, NY (US); Kwang Su Choe, Mt. Kisco, NY (US); Keith E. Fogel, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 10/336,147

(22) Filed: Jan. 2, 2003

(65) Prior Publication Data

US 2004/0132267 A1 Jul. 8, 2004

(51) Int. Cl.[7] .............................. H01L 21/36
(52) U.S. Cl. .................. 438/479; 438/164; 438/960; 117/90
(58) Field of Search ................. 438/479, 164, 438/407, 409, 412, 413, 765, 766, 960; 117/90

(56) References Cited

U.S. PATENT DOCUMENTS

| | | | | |
|---|---|---|---|---|
| 5,461,243 A | * | 10/1995 | Ek et al. ................ | 257/190 |
| 5,759,898 A | * | 6/1998 | Ek et al. ................ | 438/291 |
| 5,847,419 A | * | 12/1998 | Imai et al. .............. | 257/192 |
| 6,333,532 B1 | * | 12/2001 | Davari et al. ........... | 257/301 |
| 6,646,322 B2 | * | 11/2003 | Fitzgerald .............. | 257/531 |
| 6,774,015 B1 | * | 8/2004 | Cohen et al. ........... | 438/479 |
| 2002/0052084 A1 | * | 5/2002 | Fitzgerald .............. | 438/282 |
| 2002/0123167 A1 | * | 9/2002 | Fitzgerald .............. | 438/47 |
| 2002/0197803 A1 | * | 12/2002 | Leitz et al. ............. | 438/285 |
| 2003/0057439 A1 | * | 3/2003 | Fitzgerald .............. | 257/192 |
| 2003/0119280 A1 | * | 6/2003 | Lee et al. ............... | 438/459 |
| 2004/0075143 A1 | * | 4/2004 | Bae et al. ............... | 257/347 |
| 2004/0142541 A1 | * | 7/2004 | Cohen et al. ........... | 438/479 |
| 2004/0175872 A1 | * | 9/2004 | Yeo et al. ............... | 438/154 |
| 2004/0178406 A1 | * | 9/2004 | Chu ........................ | 257/19 |
| 2004/0227169 A1 | * | 11/2004 | Kubo et al. ............. | 257/288 |

* cited by examiner

*Primary Examiner*—M. Wilczewski
(74) *Attorney, Agent, or Firm*—Eric W. Petraske; H. Daniel Schnurmann

(57) ABSTRACT

In the preferred embodiment of this invention a method is described to convert patterned SOI regions into patterned SGOI (silicon-germanium on oxide) by the SiGe/SOI thermal mixing process to further enhance performance of the logic circuit in an embedded DRAM. The SGOI region acts as a template for subsequent Si growth such that the Si is strained, and electron and holes in the Si have higher mobility.

20 Claims, 6 Drawing Sheets

PATTERNED STRAINED SILICON FOR HIGH PERFORMANCE CIRCUITS

TECHNICAL FIELD

The field of the invention is that of integrated circuit processing to create patterned SiGe on Oxide (SGOI) regions with high relaxation (>50%) for manufacturing high performance logic circuits including embedded DRAMs.

BACKGROUND OF THE INVENTION

It has been shown that strained Si has higher n and p carrier mobilities than unstrained Si. Increased carrier mobilities lead to higher performance in CMOS circuits such as microprocessors. One way to create strained-Si is to grow a thin single crystal Si layer on a relaxed single crystal substrate that has a higher in-plane lattice parameter than that of the Si. One such relaxed substrate is Si—Ge.

For embedded memory applications, it is desirable to create patterned SOI regions. High performance CMOS integrated circuits are made on the SOI regions, whereas the dynamic memory (DRAM) circuits are made on the bulk-Si regions. Details of forming patterned SOI regions are described by Davari et al. in U.S. Pat. No. 6,333,532.

In the semiconductor industry, there has recently been a high-level of activity using strained Si-based heterostructures to achieve high mobility structures for CMOS applications. Traditionally, the prior art method to implement this has been to grow strained Si layers on thick (on the order of from about 1 to about 5 micrometers) relaxed SiGe buffer layers.

Despite the high channel electron mobilities reported for prior art heterostructures; the use of thick SiGe buffer layers has several noticeable disadvantages associated therewith. First, thick SiGe buffer layers are not typically easy to integrate with existing Si-based CMOS technology. Second, the defect densities, including threading dislocations and misfit dislocations, are from about $10^5$ to about $10^8$ defects/$cm^2$ which are still too high for realistic VSLI (very large scale integration) applications. Thirdly, the nature of the prior art structure precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped, SiGe layer to beyond the metastable critical thickness (i.e., the thickness beyond which dislocations form to relieve stress) and allow misfit dislocations to form, with the associated threading dislocations (TDs), through the SiGe buffer layer. Various buffer structures have been used to try to modulate the formation of misfit dislocations in the structures and thereby to decrease the TD density.

Another prior art approach, such as described in U.S. Pat. Nos. 5,461,243 and 5,759,898, both to Ek, et al., provides a structure with a strained and defect free semiconductor layer wherein a new strain relieve mechanism operates so that the SiGe buffer layer relaxes without the generation of TDs within the SiGe layer.

Neither the conventional approaches, nor the alternative approaches described in the Ek, et al. patents provide a solution that substantially satisfies the material demands for device applications, i.e., sufficiently low TD density, substantially little or no misfit dislocation density and control over where the TD defects will be formed. As such, there is a continued need for developing a new and improved method of forming relaxed SiGe-on-insulator substrate materials which are thermodynamically stable against defect production.

SUMMARY OF THE INVENTION

The invention relates to a method of forming both compressive and tensile Si in pre-determined locations.

A feature of the invention is the formation of tensile-stressed silicon by epitaxial growth over a layer of SiGe alloy.

A feature of the invention is the formation of compressively stressed silicon by epitaxial growth over porous silicon.

DETAILED DESCRIPTION

Method to Form Tensile Strain-Si

Figure 1A:
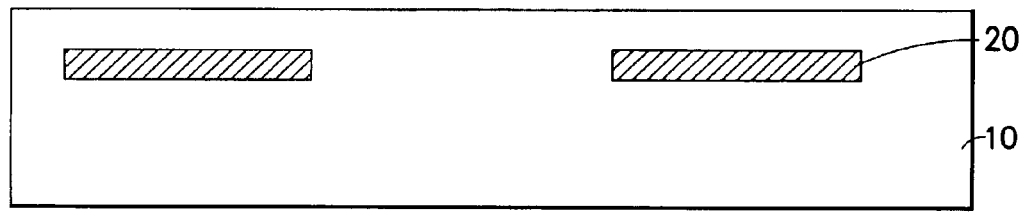
FIGS. 1–3 illustrate a series of steps in forming areas of silicon under tensile stress.

FIG. 1a shows a conventional SOI wafer 10 as the starting material, with buried oxide (BOX) layer 20 formed in it. The thickness of Box 20 can be 10 nm–10000 nm, with a preferred range of 50 nm–200 nm.

Figure 1B:
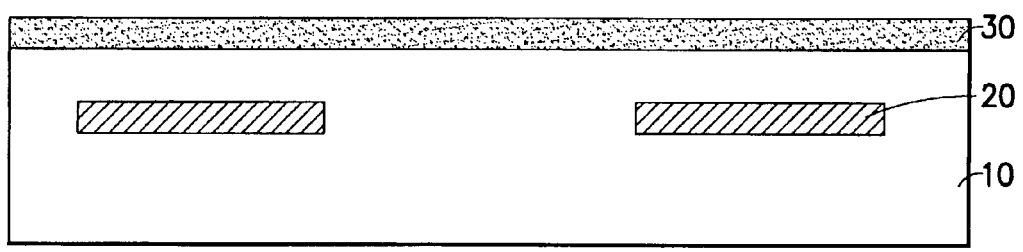

As shown in FIG. 1b, a SiGe alloy layer 30 is then grown or deposited conventionally onto the SOI wafer. The thickness of layer 30 may be in the range of 1 nm to 5 µm, preferably 20 nm–100 nm. The Ge composition can be in the range of 1–100%, more preferably 5% to 50%. The SiGe may be grown epitaxially on the silicon, or it may be amorphous or polycrystalline.

Figure 1C:
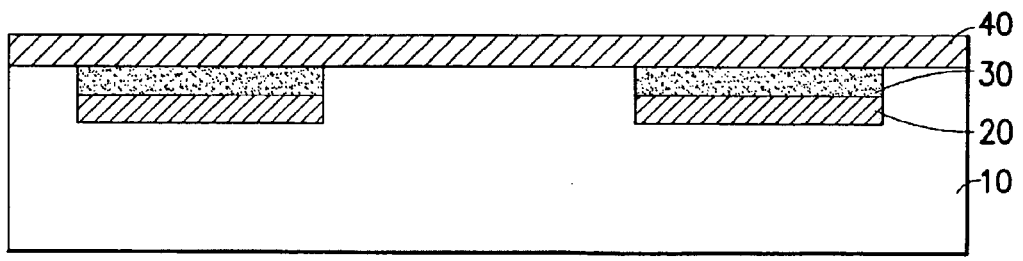

A subsequent high-temperature annealing and/or oxidation of the structure diffusively mixes the Ge throughout the layers above the insulator. In this example, as shown in FIG. 1c, an oxide layer 40 is grown thermally. The Ge is rejected from the oxide 40 during growth and thus concentrates as the film 30 is thinned during oxidation. As is shown in FIG. 1c, the preferred method converts any portion of the layer 30 (away from the BOX 20) that is not consumed by the oxide 40. Depending on the annealing/oxidation conditions employed, the Ge may concentrate above the BOX, with very little concentration of Ge (<1%) in the bulk silicon between BOX islands 20. Accordingly, FIG. 1c shows islands of Si—Ge alloy 30 above BOX 20.

Figure 1D:
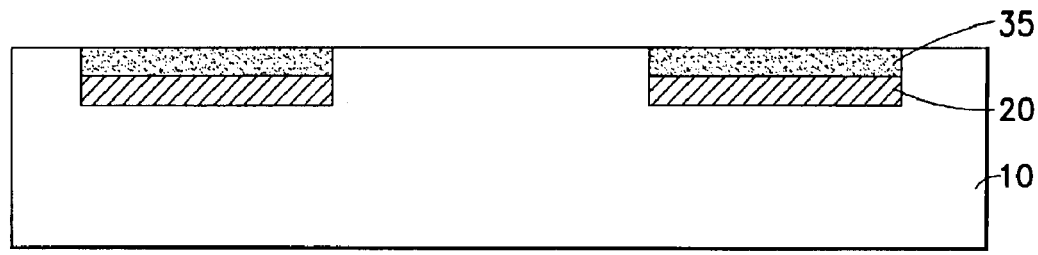

Referring to FIG. 1d, after oxide 40 is stripped, there remain islands 35 of silicon with Ge. The temperature range of the thermal mixing process that redistributes the Ge is between 1000° C. to 1350° C., with a preferred range of between 1150° C. to 1325° C. The ambient gas during thermal mixing contains an inert gas (Ar, He, N2, etc.) mixed with oxygen, with a preferred mixture of Ar/O2 in the range 80/20 to 0/100%. The Ge composition range in the SGOI areas 35 can be 1–100%, with a preferred range of 10%–60%. The thickness of islands 35, after being thinned, can be 1 nm–1000 nm, with a preferred range of 10 nm–100 nm. Islands 35 are available for formation of integrated circuit elements.

Figure 1E:
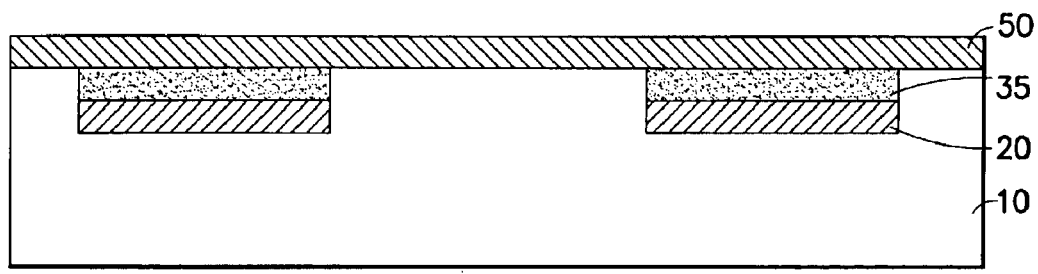
Figure 1F:
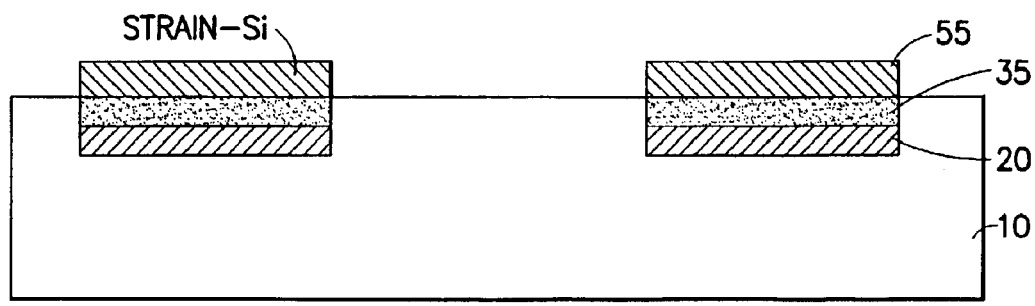

In the next step, a layer of silicon 50 is formed (FIG. 1e) and patterned to provide islands of tensile stressed silicon 55, the result being shown in FIG. 1f.

Because the SiGe alloy crystal has a larger lattice constant than Si (the magnitude depending on the Ge content), the high-temperature annealing also allows the homogenized SiGe layer to expand or "relax" thereby increasing its lattice constant with respect to that of pure Si. This increased lattice constant makes it possible to grow Si under tensile strain by epitaxial growth onto the surface of the relaxed SiGe alloy. The enhanced charge carrier transport properties within the strained Si makes this an attractive material in which to fabricate high-performance CMOS integrated circuits.

In another embodiment of this invention, a modified process is used as shown in FIG. 2. In this and other embodiments, elements with the same reference numeral is shown in FIG. 1, represent the same element shown in a previous Figure. The starting substrate, again 10, is a patterned SOI with the same BOX 20 and SOI thickness ranges as described in the preferred embodiment above. A SiGe layer 30 with the same thickness and Ge composition ranges as described for FIG. 1 is grown in the same way as in FIG. 1b. The result of the previous steps is shown in FIG. 2a.

Figure 2A:
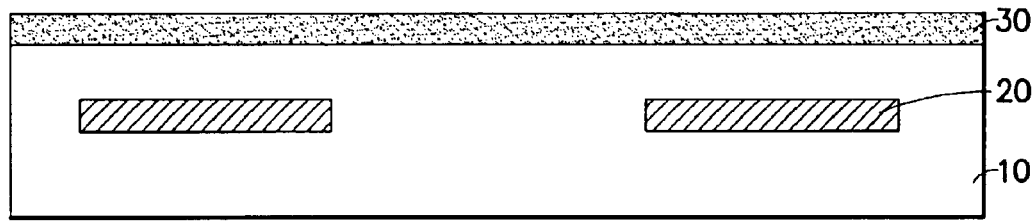
Figure 2B:
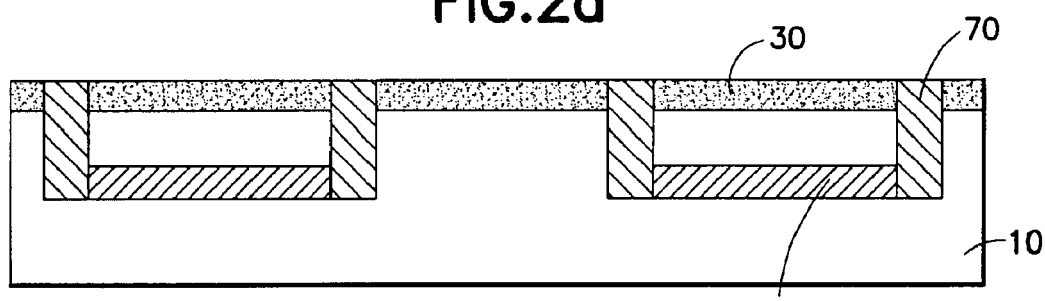

As shown in FIG. 2b, a shallow trench isolation (STI) process is performed after the structure of FIG. 2a is created such that STI regions 70 bound the patterned BOX regions.

Figure 2C:
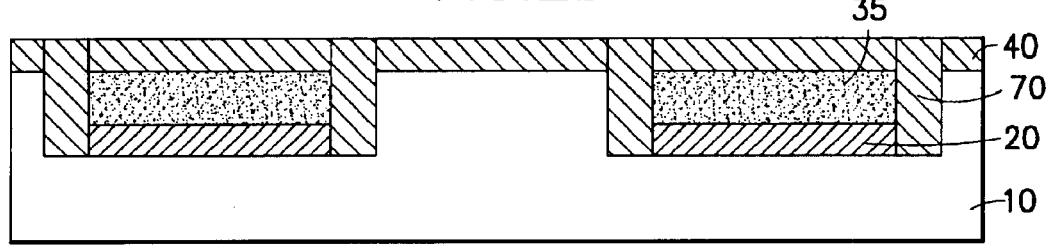
Figure 2D:
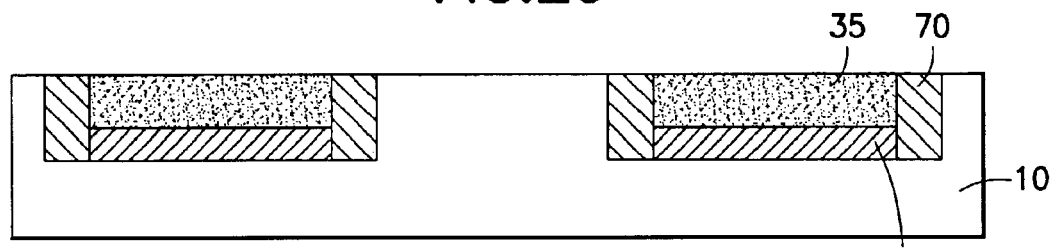

Thermal mixing is conducted in a similar manner as described above for the preferred embodiment of FIG. 1, with the growth of a layer of thermal oxide 40, shown in FIG. 2c. After the removal of thermal oxide 40 by reactive ion etching (RIE) or diluted HF dip, the structure contains patterned SGOI regions 35 bounded by STI 70 with relaxation ranges described above. The result of these preparation steps is shown in FIG. 2d, with islands of SGOI 35 bounded by STI 70.

Figure 2E:
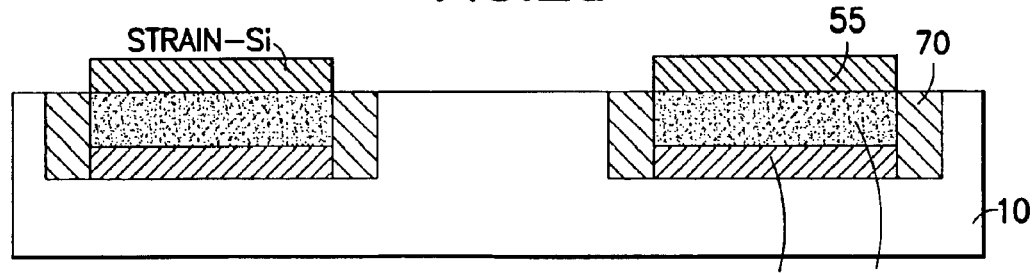

Deposition of silicon as in the embodiment of FIG. 1 and patterning of the deposited layers results in the structure shown in FIG. 2e, with islands of strained silicon 55 positioned over the SOI structure surrounded by STI 70.

Figure 3A:
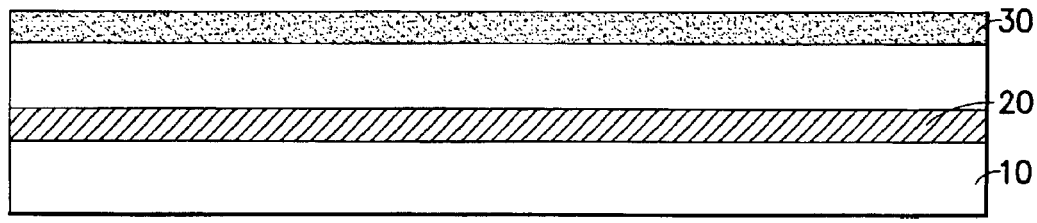

In yet another embodiment of this invention, shown in FIG. 3, the starting substrate is an unpatterned SOI layer, shown in FIG. 3a with uniform BOX layer 20 topped with SiGe layer 30. The SOI and BOX thickness ranges are the same as described in FIG. 1a. The SiGe layer 30 has thickness and composition ranges described in FIG. 1b is grown with crystal structures described in FIG. 1b (FIG. 3a).

Figure 3B:
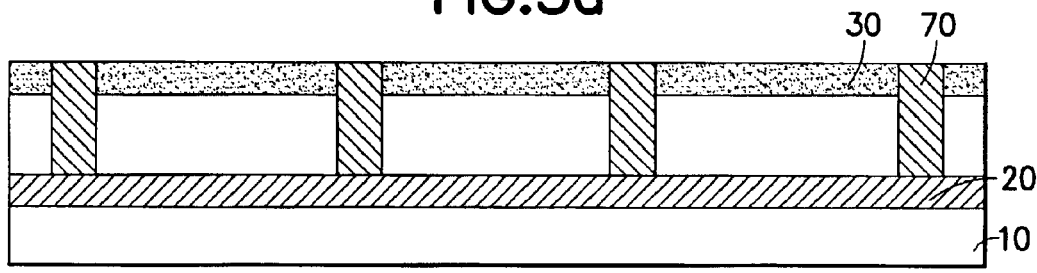
Figure 3C:
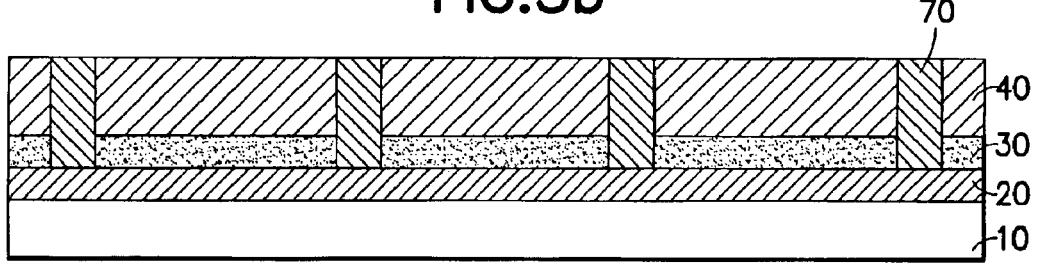

STI regions are created such that patterned SOI regions with SiGe layers are created (FIG. 3b). Thermal mixing is performed by growth of oxide 40 with the same annealing conditions as described in FIG. 1c to create patterned SGOI regions with thickness, Ge composition, and relaxation ranges as described already for FIG. 1, the result for this embodiment being shown in FIG. 3c.

Figure 3D:
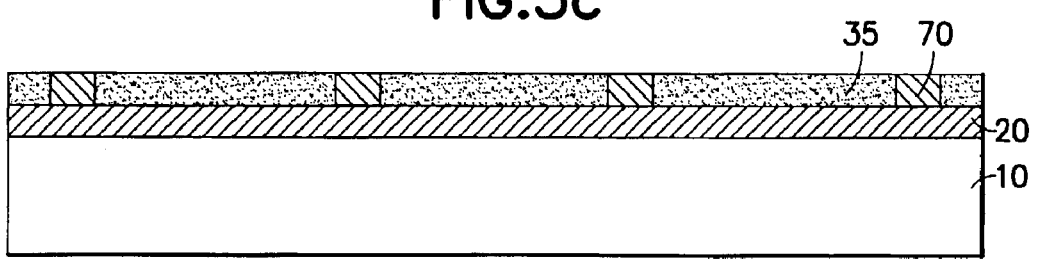

Layer 40 is stripped and the STI members 70 are planarized, leaving the structure shown in FIG. 3d, with islands 35 of silicon separated by STI members 70. The deposition of a layer of silicon and patterning produces the structure of FIG. 3e, with islands of strained silicon 55 separated by STI 70.

Figure 3E:
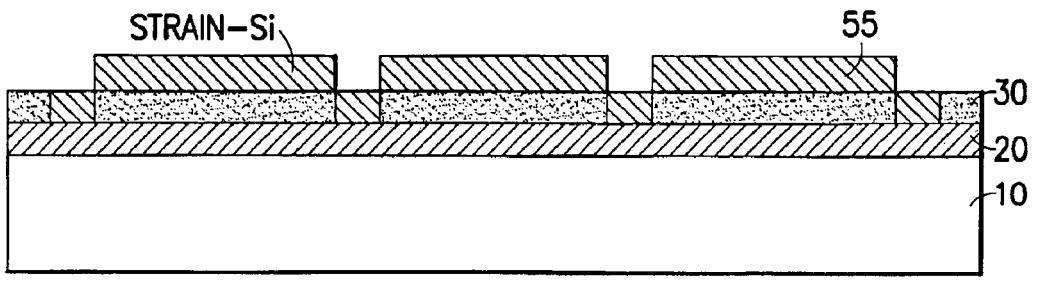

In all embodiments described above, the final step is to grow a thin Si layer 50 over the SGOI region such that it has tensile strain (FIGS. 1e, 2e and 3e). The Si thickness range can be from 1 nm to 50 nm with preferred range of 10 nm to 30 nm. The tensile strain in the Si can be from 0 to 1.5% with the preferred range of 0.5 to 1.5%.

Method to Form Compressively Strained Si

Referring to FIG. 4, another important embodiment of this invention considers formation of compressively strained Si at pre-determined locations on a Si wafer with or without a pre-existing tensile strain Si layer. Compressively strained Si is known to provide higher mobility for holes. Compressively strained Si can be achieved by creating a template of Si with in plane lattice parameter smaller than that of natural Si. This can be achieved according to the invention by forming porous-Si at p-doped regions. In the preferred embodiment, tensile and compressively strained islands of Si are formed adjacent to each other for ease in constructing CMOS circuits.

Figure 4A:
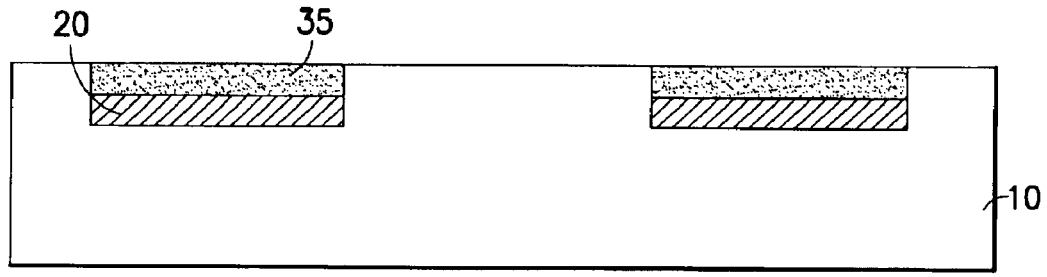
FIG. 4 illustrates a series of steps in forming areas of silicon under compressive stress.
Figure 4B:
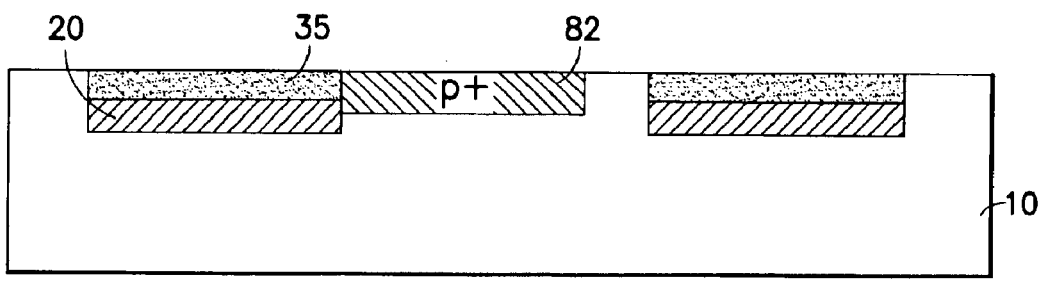

The process starts with the same patterned substrate of FIG. 1, having BOX 20 with islands 35 of silicon above it, (shown in FIG. 4a) as formed in one of the previous examples. After the formation of patterned SGOI islands 35 (as shown in FIG. 1d) the SGOI regions are covered with a photo resist or a dielectric mask (not shown) followed by a high dose Boron implantation in islands 82. The energy range of boron implant can be from 5 to 400 keV with the preferred range of 100 to 250 keV. The dose of the B can be in the range $1\times10^{15}$ to $1\times10^{17}/cm^2$ with the preferred range of $3\times10^{15}$ to $5\times10^{16}/cm^2$. After the B implant the photo resist or the dielectric mask is removed, and annealing is performed in the temperature range of 500° C. to 1150° C. with preferred range of 650° C. to 900° C. in either a furnace or a rapid thermal annealing (RTA) tool to create a p+ region 83. The result is shown in FIG. 4b.

Figure 4C:
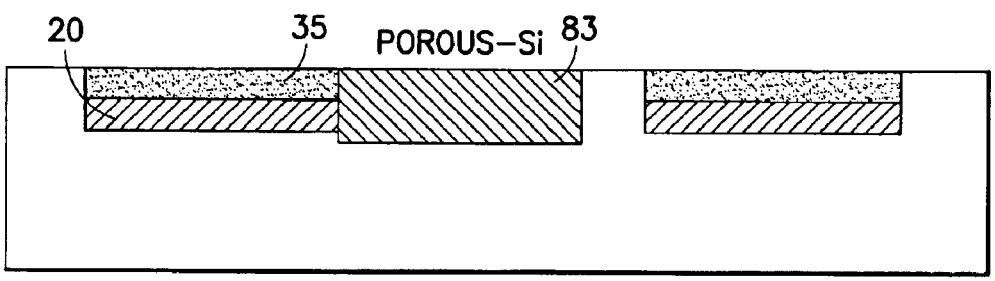

The p+ region 82 is converted into porous-Si via anodic etching to form islands 83, as shown in FIG. 4c.

Figure 4D:
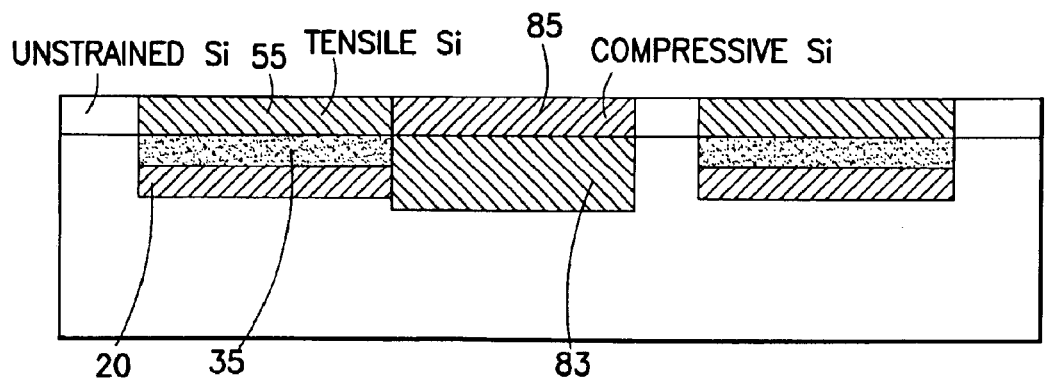

As shown in FIG. 4d, a blanket Si epitaxial growth over both the porous-Si and the islands 35 then produces a compressively strained Si 85 over the porous silicon and, in the neighboring SGOI region 55 the Si growth results in a tensile strained-Si 55.

Figure 5A:
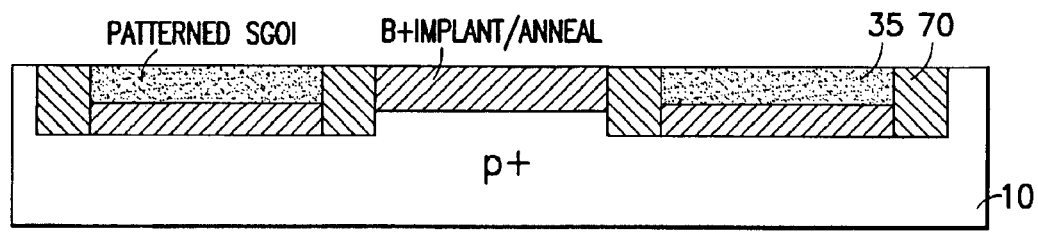
FIG. 5 illustrates an alternative version of the invention.
Figure 5B:
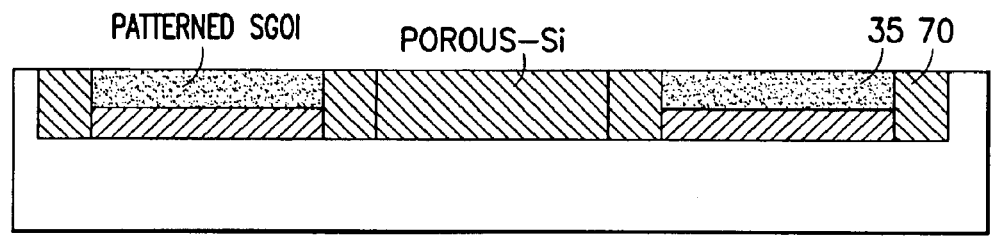
Figure 5C:
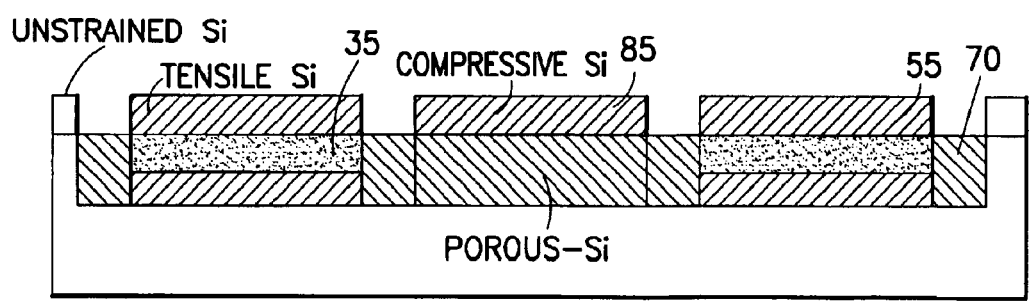

Additional embodiments for compressively and tensile strained Si are included in FIGS. 5a through 5c. FIG. 5a shows the intermediate result of previous embodiments, in which patterned SGOI islands 35 have been formed as before, separated by STI members 70. The implant/anneal steps have been also formed in areas between the islands 35. FIG. 5b shows the result of performing the anodic etching. This FIG. 5b is similar in structure to FIG. 4c, with the addition of STI members 70. A selective epitaxial growth under conventional conditions grows the epitaxial silicon only over the silicon device islands, leaving the STI as it was. The result is shown in FIG. 5c, with tensile islands 55 and compressive islands 85, separated by STI 70.

While the invention has been described in terms of a single preferred embodiment, those skilled in the art will recognize that the invention can be practiced in various versions within the spirit and scope of the following claims.

What is claimed is:

1. A method of forming regions of strained silicon in a wafer with a set of compressive regions comprising a layer of silicon under compressive stress and a set of tensile regions comprising a layer of silicon under tensile stress comprising the steps of:

providing a silicon wafer containing a set of buried oxide regions and a set of silicon device regions, a first subset of which are disposed over said set of buried oxide regions;

introducing Ge into said first subset;

forming a set of porous areas of silicon in a second subset of said device regions separate from said first subset;

forming a layer of strained silicon above at least said device regions, thereby forming said set of tensile regions over said first subset and forming said set of compressive regions over said second subset.

2. A method according to claim 1, in which said step of introducing Ge is effected by:

forming a layer of SiGe on said wafer; and mixing Ge from said SiGe into said device regions by heating said wafer.

3. A method according to claim 2, in which said layer of silicon is formed uniformly across said first subset and intervening areas and after said steps of forming porous silicon and said step of mixing Ge.

4. A method according to claim 2, in which said second subset is formed by anodic etching.

5. A method according to claim 4, further comprising an implant of a selected ion species in second subset before said step of anodic etching.

6. A method according to claim 5, in which said layer of silicon is formed uniformly across said first subset and intervening areas and after said steps of forming porous silicon and said step of mixing Ge.

7. A method according to claim 2, further comprising a step of forming a set of STI members defining said set of device islands.

8. A method according to claim 7, in which said step of forming STI members is performed before said step of mixing Ge.

9. A method according to claim 1, in which said second subset is formed by anodic etching.

10. A method according to claim 9, further comprising an implant of a selected ion species in second subset before said step of anodic etching.

11. A method according to claim 10, in which said layer of silicon is formed uniformly across said first subset and intervening areas and after said steps of forming porous silicon and said step of introducing Ge.

12. A method according to claim 1, in which said layer of silicon is formed uniformly across said first subset and intervening areas and after said steps of forming porous silicon and said step of introducing Ge.

13. A method according to claim 1, further comprising a step of forming a set of STI members defining said set of device islands.

14. A method according to claim 13, in which said step of forming STI members is performed before said step of mixing Ge.

15. A method according to claim 14, in which said step of forming a layer of silicon comprises forming a self-aligned layer of epitaxial silicon over said device regions.

16. A method according to claim 13, in which said step of forming a layer of silicon comprises forming a self-aligned layer of epitaxial silicon over said device regions.

17. A method of forming regions of strained silicon in a wafer with a set of compressive regions comprising a layer of silicon under compressive stress and a set of tensile regions comprising a layer of silicon under tensile stress comprising the steps of:

providing a silicon on insulator wafer containing a uniform buried oxide region and a set of silicon device regions, a first subset of which are disposed over said set of buried oxide regions;

introducing Ge into said first subset;

forming a set of porous areas of silicon in a second subset of said device regions separate from said first subset;

forming a layer of Si above at least said device regions, thereby forming said set of tensile regions over said first subset and forming said set of compressive regions over said second subset.

18. A method according to claim 17, in which said step of introducing Ge is effected by:

forming a layer of SiGe on said wafer; and mixing Ge from said SiGe into said device regions by heating said wafer.

19. A method according to claim 18, in which said second subset is formed by anodic etching.

20. A method according to claim 19, further comprising an implant of a selected ion species in second subset before said step of anodic etching.

* * * * *